(12) United States Patent
Giles et al.

(10) Patent No.: US 9,159,830 B2
(45) Date of Patent: Oct. 13, 2015

(54) FIELD EFFECT TRANSISTOR

(71) Applicant: Infineon Technologies AG, Neubiberg (DE)

(72) Inventors: Luis-Felipe Giles, Munich (DE); Frank Lau, Bad Aibling (DE); Rainer Liebmann, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/286,381

(22) Filed: May 23, 2014

(65) Prior Publication Data

US 2014/0252498 A1    Sep. 11, 2014

Related U.S. Application Data

(62) Division of application No. 11/559,572, filed on Nov. 14, 2006, now Pat. No. 8,772,097.

(30) Foreign Application Priority Data

Nov. 14, 2005   (DE) .......................... 10 2005 054 219

(51) Int. Cl.
*H01L 21/70* (2006.01)
*H01L 29/78* (2006.01)
*H01L 21/265* (2006.01)

(52) U.S. Cl.
CPC ...... *H01L 29/7849* (2013.01); *H01L 21/26506* (2013.01); *H01L 29/78* (2013.01); *H01L 29/7843* (2013.01)

(58) Field of Classification Search
USPC ............... 257/204, 288, 368, 18, 19, 20, 347, 257/607; 438/422, 151, 162, 528, 407, 411, 438/527, 514, 526, 197
See application file for complete search history.

(56) References Cited

U.S. PATENT DOCUMENTS

| | | |
|---|---|---|
| 5,374,564 A | 12/1994 | Bruel |
| 6,316,333 B1 * | 11/2001 | Bruel et al. ................... 438/458 |
| 6,333,532 B1 | 12/2001 | Davari et al. |
| 6,570,217 B1 | 5/2003 | Sato et al. |
| 6,852,604 B2 * | 2/2005 | Baba .............................. 438/373 |
| 7,193,294 B2 * | 3/2007 | Yoshimura et al. ........... 257/607 |
| 2005/0176222 A1 | 8/2005 | Ogura |
| 2005/0205859 A1 | 9/2005 | Currie et al. |
| 2006/0148155 A1 | 7/2006 | Coleman |

FOREIGN PATENT DOCUMENTS

EP    1365447 A2    11/2003

OTHER PUBLICATIONS

Shimizu, A. et al., "Local Mechanical-Stress Control (LMC): A new Technique for CMOS-Performance Enhancement", IEDM Tech. Digest, 2001, pp. 433-436.

(Continued)

*Primary Examiner* — Thanh Y Tran
(74) *Attorney, Agent, or Firm* — Schiff Hardin LLP

(57) ABSTRACT

In a method for fabricating a field effect transistor, a first source/drain region and a second source/drain region are formed in a substrate. A channel region is formed between the first source/drain region and the second source/drain region. A gate region is formed on the channel region. Micro-cavities are formed in the substrate at least below the channel region, and the micro-cavities are oxidized.

7 Claims, 9 Drawing Sheets

(56) References Cited

OTHER PUBLICATIONS

Ota, K. et al., "Novel Locally Strained Channel Technique for High Performance 55mm CMOS", IEDM Tech. Digest, 2002, pp. 27-30.
Ghani, T. et al., "A 90mm High Volume Manufacturing Logic Technology Featuring Novel 45mm Gate Length Strained Silicon CMOS Transistors", IEDM Tech. Digest, 2003, pp. 978-980.
Pidin, S. et al., "A novel Strain Enchanced CMOS Architecture Using Selectively Deposited High Tensile and High Compressive Silicon Nitride Films", IEDM Tech. Digest, 2004, pp. 213-216.
Chen, M. et al., "Does-Energy Match for the Formation of High-Integrity Buried Oxide Layers in Low-Dose Separation-By-Implantation-of-Oxygen Materials", Applied Physics Letters, vol. 80, No. 5, 2002, pp. 880-882.
Takahashi, Y. et al., "Counter-Oxidation of Superficial Si in Single-Crystalline Si on SiO2 Structure", Appliced Physics Letters, vol. 65, No. 23, 1994, pp. 2987-2989.
Raineri, V. et al., "Silicon-on-Insulator Produced by Helium Implantation and Thermal Oxidation", Applied Physics Letters, vol. 66, No. 26, pp. 3654-3656.

* cited by examiner

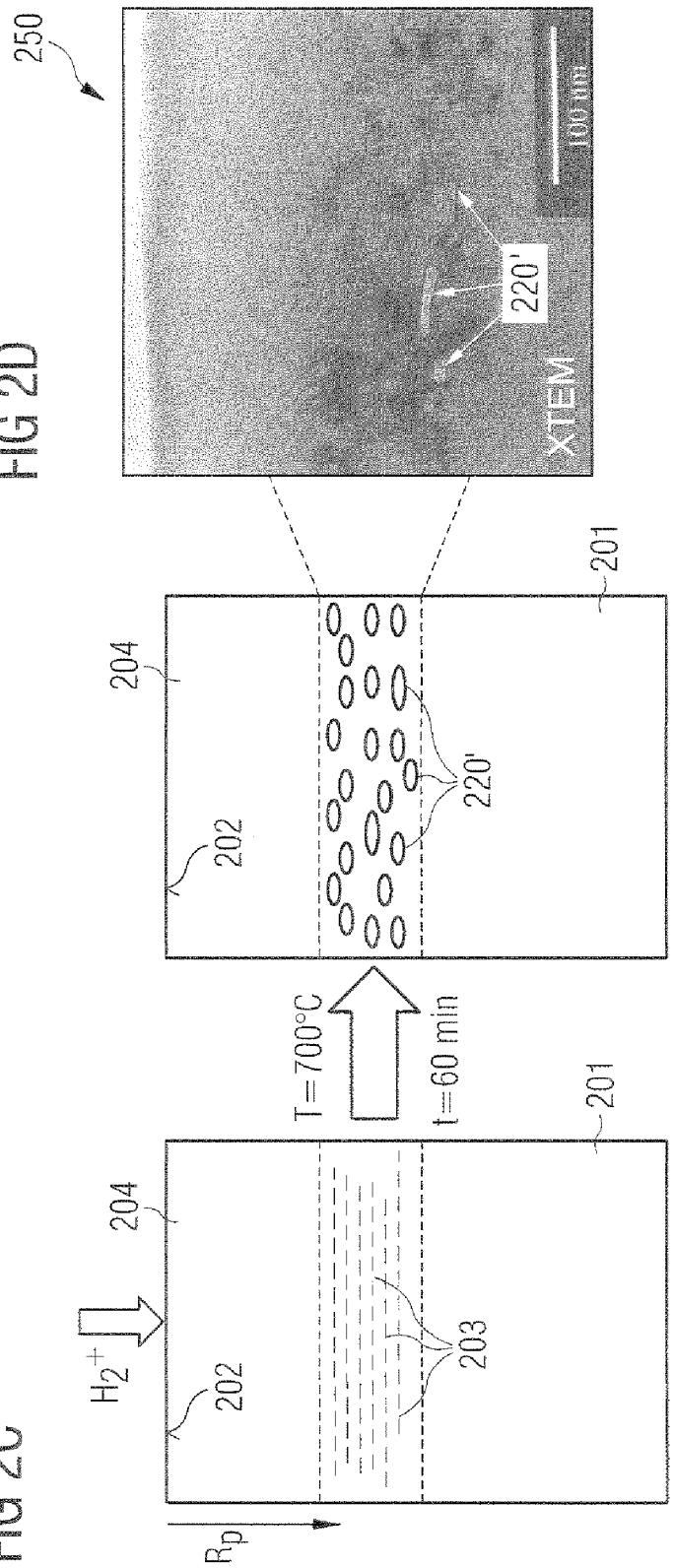

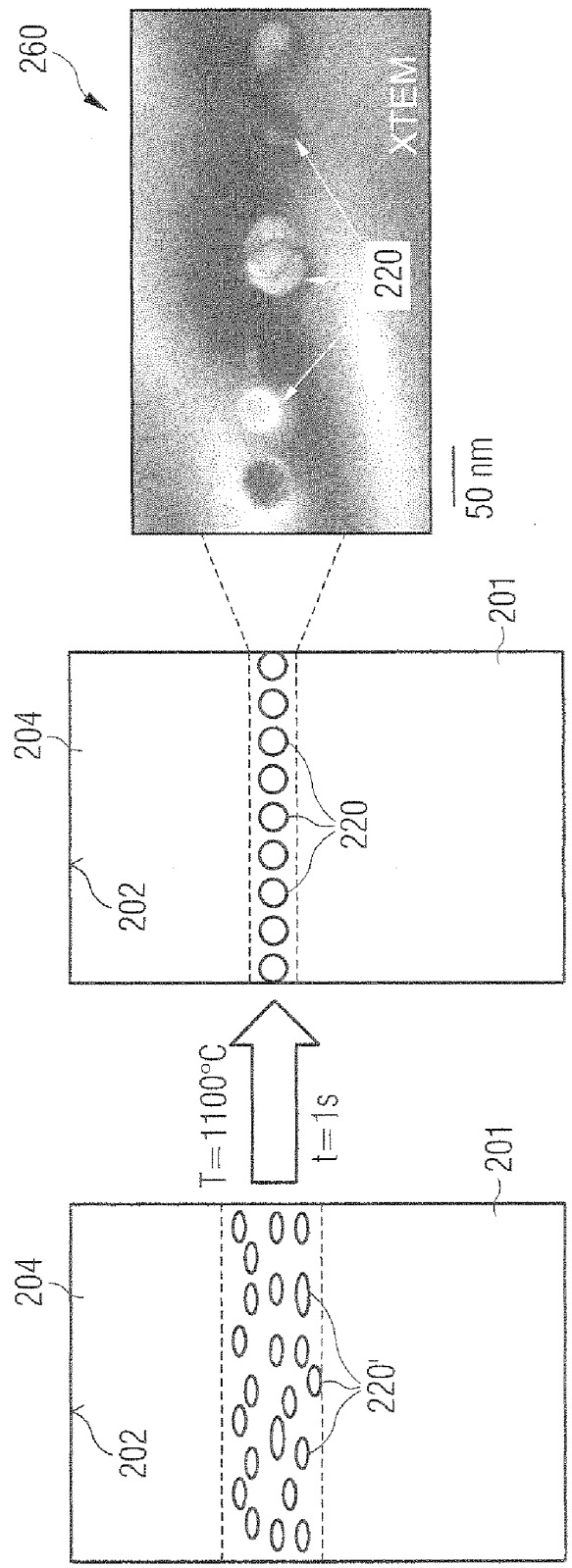
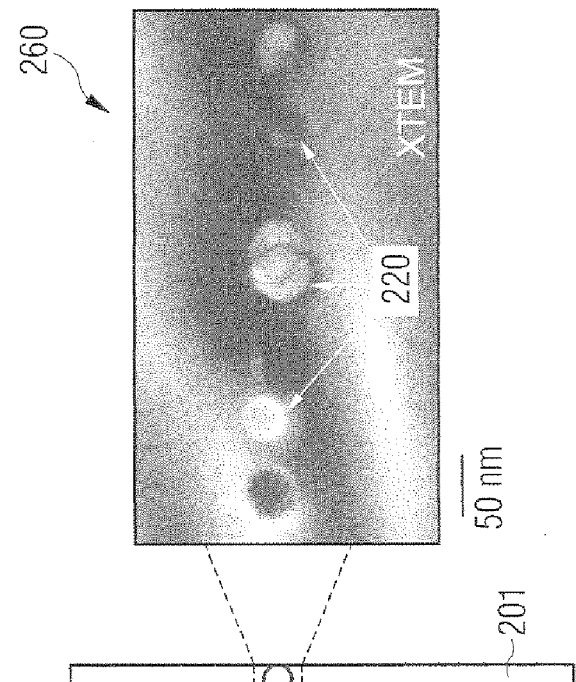

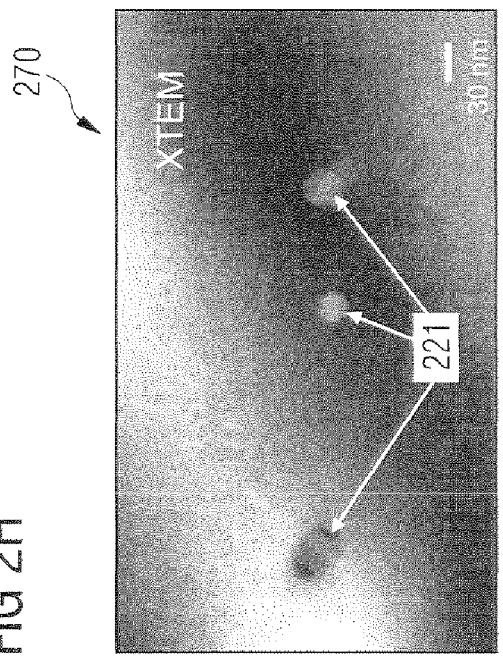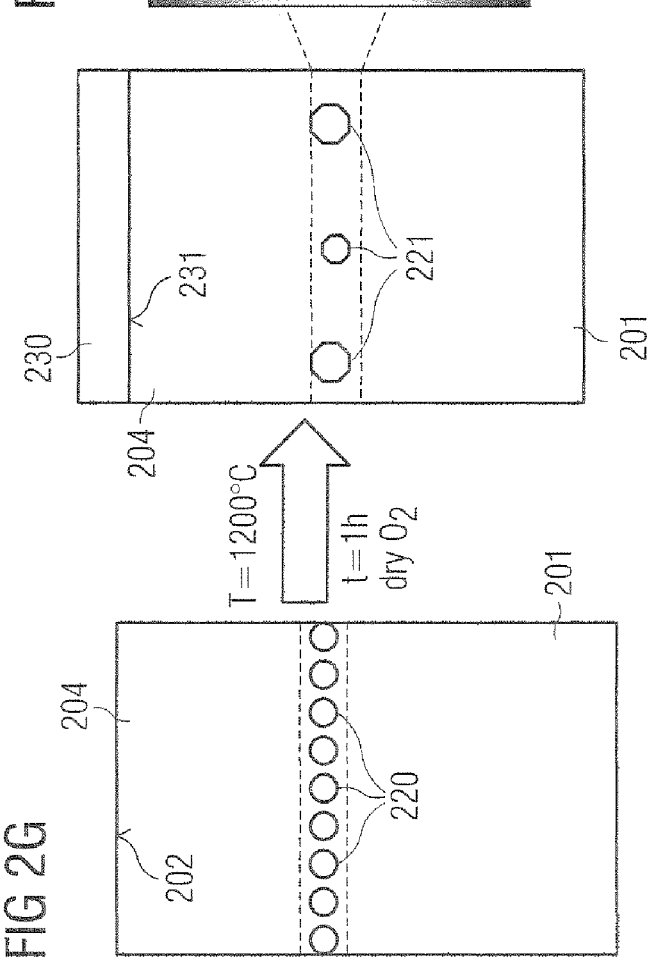

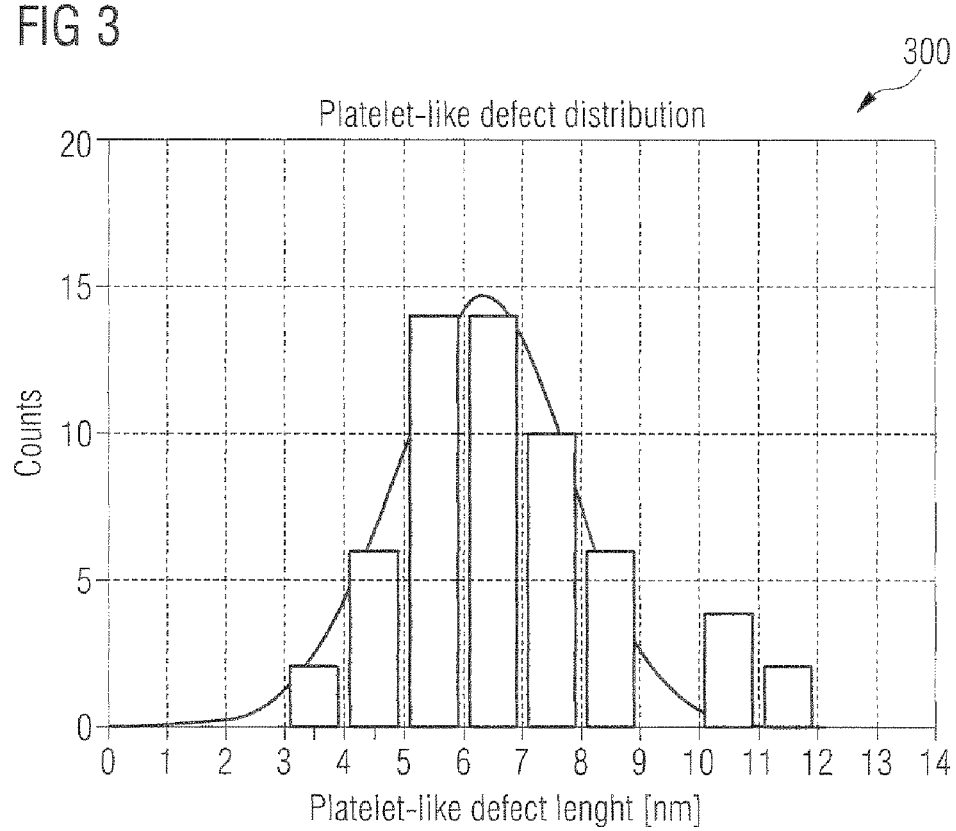

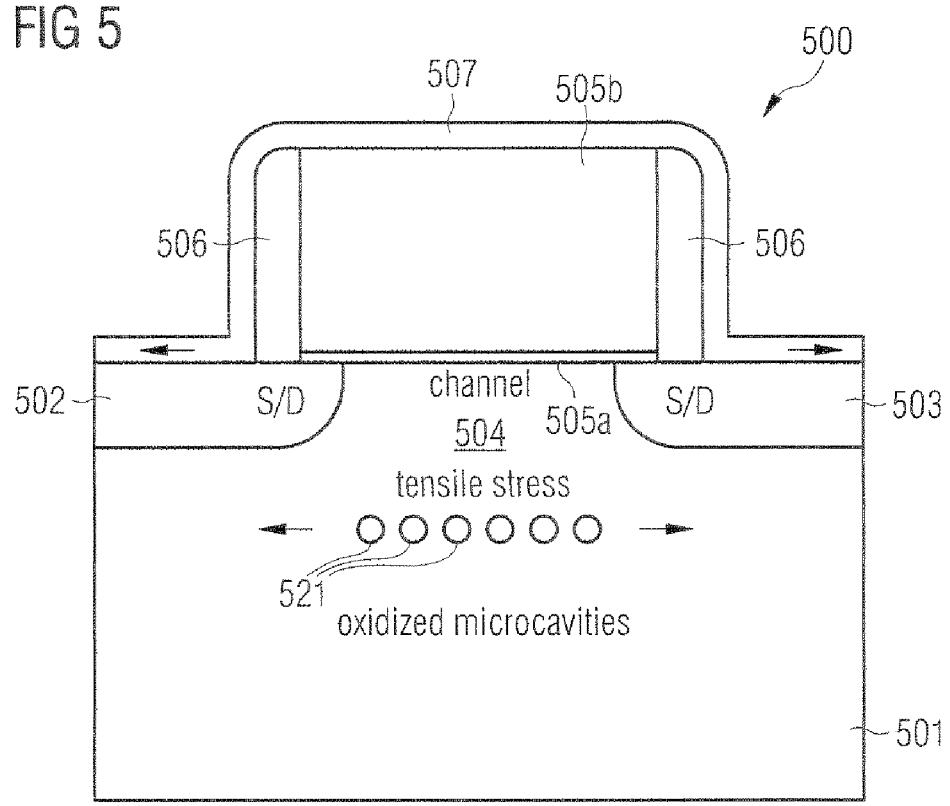

FIELD EFFECT TRANSISTOR

CROSS-REFERENCE TO RELATED APPLICATION

This application is a divisional of U.S. patent application Ser. No. 11/559,572, which was filed Nov. 14, 2006, which claims priority to German Patent Application Serial No. 10 2005 054 219.0, which was filed Nov. 14, 2005, and is incorporated herein by reference in its entirety.

BACKGROUND OF THE INVENTION

The invention relates to a method for fabricating a field effect transistor and to a field effect transistor.

It is desirable to improve the performance of field effect transistors.

BRIEF DESCRIPTION OF THE FIGURES

Exemplary embodiments of the invention are illustrated in the figures and are explained in more detail below. In the figures, identical or similar elements, insofar as is expedient, are provided with the same or identical reference symbols. The illustrations shown in the figures are depicted such that they are schematic and therefore not true to scale.

In the figures:

FIG. 2C shows a further process step of the method for fabricating a field effect transistor in accordance with the first exemplary embodiment of the invention;

FIG. 2D shows a first XTEM micrograph of micro-cavities;

FIG. 2E shows a further process step of the method for fabricating a field effect transistor in accordance with the first exemplary embodiment of the invention;

FIG. 2F shows a second XTEM micrograph of micro-cavities;

FIG. 2G shows a further process step of the method for fabricating a field effect transistor in accordance with the first exemplary embodiment of the invention;

FIG. 2H shows a first XTEM micrograph of oxidized micro-cavities;

FIG. 3 shows a length distribution of micro-platelets;

FIG. 5 and FIG. 6 show a field effect transistor in accordance with one exemplary embodiment of the invention.

DESCRIPTION OF THE INVENTION

So-called "stress engineering", that is to say the deliberate utilization of stress effects in semiconductor components such as, for example MOS field effect transistors (metal oxide semiconductor), is a widespread method for improving the performance of MOS field effect transistors by increasing the charge carrier mobility in the conductive channel.

While p-MOS field effect transistors require compressive stress for increasing the hole mobility, tensile stress is required for increasing the electron mobility in n-MOS field effect transistors.

Under suitable conditions it is possible to deposit nitride layers which can produce both tensile stress fields and compressive stress fields in the channel of CMOS elements (Complementary Metal Oxide Semiconductor). One disadvantage of this method, however, is that only a fraction of the intrinsic nitride stress is transmitted into the channel on account of the large distance between the nitride layer and the channel.

Another method for producing stress fields is the so-called "Embedded Epitaxial Silicon/Germanium (eSi/Ge)" technique, which involves forming expanding silicon/germanium in the source/drain regions very close to the channel. One disadvantage of the eSi/Ge method, however, is that it can only be used to produce compressive stress. Therefore, this technique can only be used for p-MOS field effect transistors.

As already mentioned, by contrast, tensile stress is required for improving the performance of n-MOS field effect transistors. One possibility for producing additional stress in the channel of n-MOS field effect transistors consists for example in forming buried oxide layers with the aid of selective SIMOX techniques (separation by implanted oxygen).

However, selective SIMOX has the following disadvantages:

(1) a selective SIMOX process is expensive since e.g. high oxygen implantation doses of $10^{18}$ $O_2$ $cm^{-2}$ and high thermal budgets (e.g. tempering or annealing at 1300° C. for 6 h) are necessary.

Figure 1:
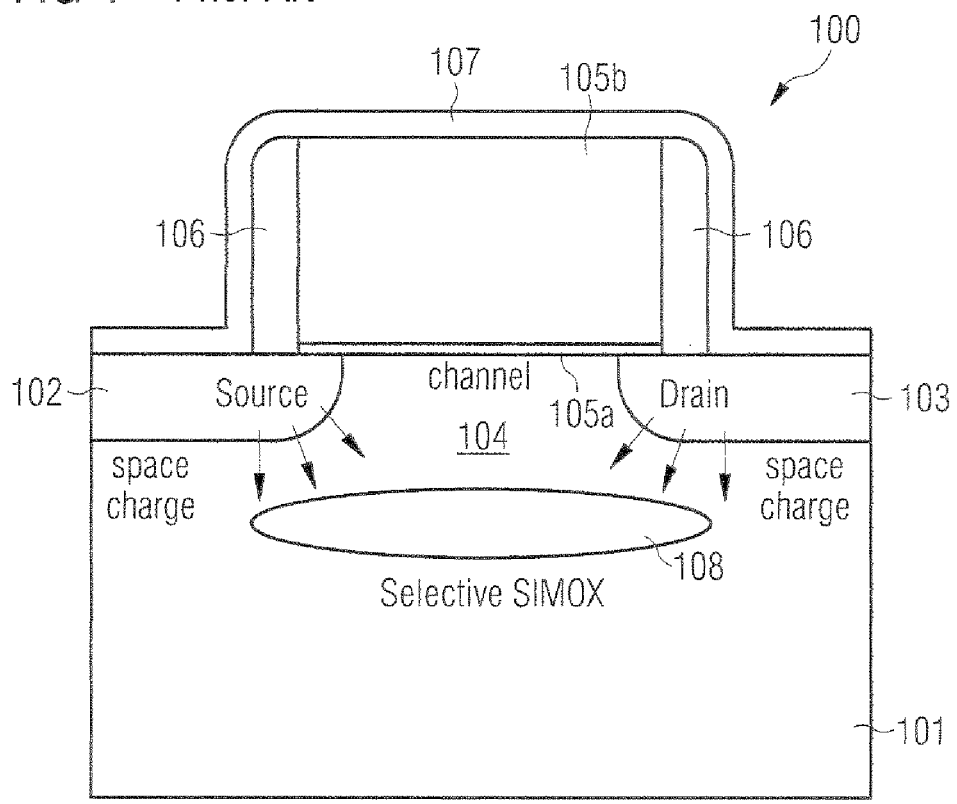
FIG. 1 shows a conventional field effect transistor with a buried oxide layer.

(2) There is a high probability of the buried oxide layers insulating the channel region of the transistor from the bulk, which is shown schematically in FIG. 1.

FIG. 1 shows a conventional field effect transistor 100 comprising a substrate 101, in which substrate 101 a source region 102, a drain region 103 and also a channel region 104 are formed. A gate insulating layer 105a (gate dielectric) is formed on the channel region 104, and a conductive gate layer 105b (gate electrode) is formed on the gate insulating layer 105a. The gate insulating layer 105a and the conductive gate layer 105b are part of the transistor gate, which is encapsulated by electrically insulating spacers 106. A liner 107 (e.g. made of a nitride material) is additionally formed on the spacers 106, the source region 102, the drain region 103 and the conductive gate layer 105b. A buried oxide layer 108 is formed below the channel 104, said buried oxide layer being formed with the aid of a selective SIMOX method.

The illustration in FIG. 1 reveals that the continuous oxide layer 108 electrically insulates the channel 104 from the bulk of the substrate 101. Moreover, the source/drain space charge regions can extend into the oxide region 108, which is represented by the arrows. Floating body effects and/or charging effects can occur as a consequence.

Embodiments of the invention which are described in connection with the method for fabricating a field effect transistor apply analogously to the field effect transistors as well, and vice versa.

In a method for fabricating a field effect transistor in accordance with one embodiment of the invention, a first source/drain region and a second source/drain region are formed in a substrate. A channel region is formed between the first source/drain region and the second source/drain region. A gate region is formed on the channel region. Micro-cavities are formed in the substrate at least below the channel region. The micro-cavities are oxidized, for example in such a way that a region is formed in which an increased tensile stress is present relative to the undamaged crystal lattice of the substrate, and which comprises at least one partial region of the channel region.

In accordance with another embodiment of the invention, a field effect transistor is provided. The field effect transistor has a substrate, a first source/drain region formed in the substrate, and a second source/drain region formed in the substrate. Furthermore, the field effect transistor has a channel region formed between the first source/drain region and the second source/drain region. Furthermore, the field effect transistor has a plurality of oxidized micro-cavities formed at least below the channel region in the substrate. The oxidized micro-cavities are formed for example in such a way that at least one partial region of the channel region has an increased tensile stress relative to the undamaged crystal lattice of the substrate.

In accordance with another embodiment of the invention, tensile stress or a tensile stress field is produced in a field effect transistor, more precisely in the channel region or at least one partial region of the channel region of a field effect transistor. For this purpose, during the fabrication of the field effect transistor, in addition to the formation of the source/drain regions, the channel region and the gate region (gate), micro-cavities are formed at least below the channel region. Said micro-cavities serve as seeds for a subsequent internal oxidation, that is to say that the micro-cavities are oxidized. The oxidized micro-cavities produce a tensile stress field extending at least into a partial region of the channel region. In other words, tensile stress is produced on account of the oxidized micro-cavities in the channel region (or in a partial region of the channel region), thereby increasing the charge carrier mobility in the channel and thus improving the performance or functionality of the transistor.

In the context of this description, a micro-cavity is to be understood to mean for example a cavity in the substrate with an extent in the micrometers range in all spatial directions, for example with an extent in the micrometers range in one or two spatial directions and with an extent in the nanometers range in one or two spatial directions or with an extent in the nanometers range in all spatial directions. It is thus possible for a micro-cavity to have a width of for example 5 nm to 100 nm or hundreds of nm, for example 10 nm to 100 nm or hundreds of nm, and also a length of 20 nm to 100 nm or hundreds of nm and a height of 10 nm to 100 nm or hundreds of nm, for example approximately 50 nm.

In accordance with another embodiment of the invention, the substrate is formed as a silicon substrate, e.g. as a silicon wafer. By way of example, a (100) silicon substrate or a (111) silicon substrate may be used as the silicon substrate.

In accordance with another embodiment of the invention, the field effect transistor is formed as an n-MOS field effect transistor with an n-doped first source/drain region, an n-doped second source/drain region and a p-doped channel region. The standard techniques known in CMOS technology, such as ion implantation for example, may be used for doping. Boron may be used as a dopant for the p-type doping of the channel, and arsenic and/or phosphorus may be used for the n-type doping of the source/drain regions.

In accordance with another embodiment of the invention, the gate region or the gate of the field effect transistor has a gate insulating layer (gate dielectric) (e.g. made of silicon dioxide) formed on the channel region, and also a conductive gate layer or gate electrode (e.g. made of polysilicon or some other conductive material) formed on the gate insulating layer or the gate dielectric.

In accordance with another embodiment of the invention, micro-platelets are formed in the substrate and the micro-cavities are formed from the micro-platelets. To put it another way, the formation of the micro-cavities is effected with the aid of the formation of micro-platelets. In other words, micro-platelets, that is to say microscopic platelet-like defects in the crystal lattice structure of the substrate, are formed below the channel region, and micro-cavities are formed from the micro-platelets.

In accordance with another embodiment of the invention, light ions are implanted into the substrate, so that the micro-cavities are formed in the substrate.

In accordance with another embodiment of the invention, the light ions are implanted into the substrate, so that the micro-platelets are formed in the substrate.

In other words, the formation of the micro-cavities and the micro-platelets, respectively, may be effected by the implantation of light ions, that is to say ions having a low mass or having a small mass number, to put it another way by light ion implantation.

The introduction of light ions into the substrate in order to form the micro-platelets or micro-cavities constitutes a very simple and reliable mechanism for fabricating the micro-cavities which is process-compatible with present-day CMOS processes (Complementary Metal Oxide Semiconductor). Furthermore, ion implanters are among customary apparatuses in the context of a semiconductor process, so that it is not necessary to fundamentally alter the processes for fabricating the field effect transistor or even to procure new apparatuses.

In accordance with another embodiment of the invention, $H_2^+$ ions, $He^+$ ions, $F^+$ ions, $Ne^+$ ions, $Cl^+$ ions or $Ar^+$ ions may be implanted into the substrate as light ions.

The light ions implanted into the substrate clearly have the tendency to break covalent bonds in the substrate (e.g. covalent silicon bonds in a silicon substrate), whereby thin platelets are formed in oversaturated regions. To put it another way, the implantation of light ions results in the production of platelet-like defects or lattice defects in the crystal lattice of the substrate (e.g. in the crystal lattice of a silicon wafer). In this case, the micro-platelets are preferably formed in the vicinity of the maximum or peak of the light ion concentration in the substrate. The depth $R_p$ of the concentration maximum of the implanted light ions is referred to as projected range $R_p$, depth being understood as the distance from the substrate surface. It follows from the above that the concentration of the micro-platelets is also maximal in the vicinity of $R_p$.

The micro-platelets may be elongated along a plane of symmetry of the substrate, depending on the orientation of a substrate surface. By way of example, the platelets may be elongated along the (100) plane in the case of a silicon substrate (silicon wafer) having a (100) surface orientation, and correspondingly along the (111) plane in the case of a (111) substrate (wafer), the length of the micro-platelets (that is to say the extent parallel to the abovementioned plane of symmetry) following a distribution with a mean value and a standard deviation which may depend for example on the implantation dose $\Phi$ and/or on the implantation energy E of the implanted light ions.

The dimensions of the micro-platelets may depend on the implantation conditions (e.g. implantation dose and/or implantation energy) and the conditions during an annealing step. In general, the length and the width of the micro-platelets may be of the order of magnitude of approximately 10 nm, and the height (that is to say the extent perpendicular to the abovementioned plane of symmetry) of the micro-platelets may be of the order of magnitude of approximately 0.54 nm.

By means of the implantation dose $\Phi$ and/or the implantation energy E of the light ions, also the depth and the extent of the region in which the micro-platelets are formed can be influenced. In this context, depth once again means the distance from the substrate surface, and extent means the extent in the direction of the normal to the surface, that is to say the extent along the [100] direction in the case of a (100) substrate.

In other words, in accordance with one embodiment of the invention, by means of varying the two parameters dose $\Phi$ and energy E (and possibly other parameters), it is possible to influence the depth $R_p$ (projected range) of the light ion concentration maximum and consequently the position and/or the extent of the region in which micro-platelets are preferably formed.

By means of the depth and the extent of the micro-platelet region, it is possible in turn to influence the depth of the region under stress, to put it another way the stressed region, in the substrate. In other words, $R_p$ can be used to influence how deeply below the substrate surface the stressed region is formed. $R_p$ in turn may be controlled e.g. in a simple manner with the aid of the implantation energy E.

It must be taken into account in this connection that in the case of a small depth of the stressed region, the latter possibly overlaps the source/drain regions of the field effect transistor. Leakage currents may occur in the transistor in this case. On the other hand, in the case of large depths, to put it another way in the case of the stressed regions situated very deeply, the magnitude of the stress in the channel region decreases.

In accordance with another embodiment of the invention, the implantation energy E may be optimized so as to obtain a compromise between the two effects mentioned above.

With the use of an approximately 10 nm thick screen oxide during an $H_2^+$ ion implantation, a depth or projected range $R_p$ of approximately 100 nm can be achieved for example with an implantation energy E=10 keV and an implantation dose $\Phi=10^{16} H_2/cm^2$, and a depth or projected range $R_p$ of approximately 850 nm can be achieved with an implantation energy E=150 keV and an implantation dose $\Phi=10^{16} H_2/cm^2$.

Another embodiment of the invention provides for the light ions to have an implantation energy of between 10 keV and 150 keV.

In accordance with another embodiment of the invention, the light ions are implanted with a dose of between $10^{15} cm^{-2}$ and $4 \times 10^{17} cm^{-2}$.

Yet another embodiment of the invention provides for an additional mask to be used during the implantation of the light ions. This mask serves to restrict the lateral extent of the stressed region to the area of the channel region. Clearly, the use of a mask makes it possible to block the implantation of the light ions in predetermined regions of the substrate, so that no micro-platelets are formed in said predetermined regions.

In accordance with another embodiment, a hard mask composed of an oxide material and a nitride material, for example, may be used as the mask.

In accordance with another embodiment of the invention, the opening of the mask may be optimized to the effect that maximum stresses or tensile stress values are obtained. The mask may have a size similar to the length of the gate region (e.g. of the polysilicon gate).

In accordance with another embodiment of the invention, the micro-cavities may be formed by virtue of a thermal treatment or a tempering of the substrate being effected after the formation of the micro-platelets. In other words, the substrate (e.g. the wafer) is tempered or heated; to put it in yet another way, a so-called annealing step is carried out.

In accordance with another embodiment of the invention, the tempering or the process of heat treating, to put it another way the heating, of the substrate (or wafer) may be effected with a low thermal budget. By way of example, the substrate may be heated to a temperature of between 600° C. and 800° C. during the thermal treatment, and the heating may be effected for a duration of between 10 min and 2 h.

In accordance with another embodiment of the invention, the thermal treatment with a low thermal budget may result in an outdiffusion of the implanted light ions from the substrate in the form of neutral atoms or molecules. That is to say that the heating results in the outdiffusion of $H_2$ molecules from the substrate in the case of implanted $H_2^+$ ions, the outdiffusion of He atoms in the case of implanted He ions, the outdiffusion of F atoms in the case of implanted $F^+$ ions, etc.

The outdiffusion of the implanted light ions in the form of neutral atoms or molecules leads to the formation of a network or a band, to put it another way a strip-type region, of micro-cavities from the micro-platelets at the range or projected range $R_p$.

In accordance with another embodiment of the invention, the micro-cavities in the band may have a length of 10 nm to 100 nm, a width of 10 nm to 100 nm, and a height of 10 nm to 100 nm.

Both the size and the density of the micro-cavities formed depend on the process parameters of the method steps described above (light ion implantation with dose $\Phi$ and energy E, thermal treatment with temperature T and duration t). The process parameters can be chosen or optimized such that the density and the size of the micro-cavities in each case remain below predetermined threshold values, so that stripping or delamination of the silicon substrate does not occur. In other words, the density and/or the size of the micro-cavities are small enough such that the cohesion of the substrate is assured and layer splitting is thus avoided.

In accordance with another embodiment of the invention, the use of a low thermal budget during the thermal treatment (low temperature anneal) additionally makes it possible to prevent the micro-cavities formed from being completely resolved.

Another embodiment of the invention provides for a second thermal treatment to be effected after the thermal treatment, in such a way that a conservative ripening process of the micro-cavities is effected, during which a thinner band having larger micro-cavities is formed from the band of micro-cavities. In this context, conservative is understood to mean that the total volume of micro-cavities is maintained during the ripening process. The ripening process causes a large number of relatively small micro-cavities to form a smaller number of larger micro-cavities. This clearly takes place by two or more small micro-cavities "merging together" to form a larger micro-cavity. This process may also be referred to as a coarsening process.

Another embodiment of the invention provides for a thin band, e.g. having a thickness of approximately 20 nm to 100 nm, of micro-cavities to be formed in the course of the ripening process, in which case the micro-cavities may have a size of approximately 40 nm, and the density of the micro-cavities may be approximately $10^{11} cm^{-3}$.

In accordance with another embodiment of the invention, the second thermal treatment is effected in such a way that the substrate is heated to a temperature of between 1000° C. and 1300° C. The heating may be effected for a duration of between 1 µs and 1 s.

In accordance with another embodiment of the invention, the oxidation of the micro-cavities is effected by means of a high-temperature treatment and by means of the introduction of oxygen into the micro-cavities. In other words, the high-temperature treatment in an oxidizing atmosphere or environment leads to an internal oxidation of the micro-cavities.

In accordance with another embodiment of the invention, the high-temperature treatment may be effected in such a way that the substrate is heated to a temperature of between 1000° C. and 1350° C. The heating may be effected for example for a duration of between 30 min and 2 h.

Another embodiment of the invention provides for the introduction of oxygen into the micro-cavities to be effected by thermal indiffusion.

Yet another embodiment provides for the introduction of oxygen to be effected by the implantation of oxygen, to put it another way by oxygen implantation.

In accordance with one embodiment of the invention, silicon dioxide precipitates may be formed by means of oxidation of the micro-cavities. Said silicon dioxide precipitates form a non-continuous (discontinuous) layer below the channel region of the transistor. Since the volume of the silicon dioxide ($SiO_2$) that arises is approximately 2.25 times as large as the volume of the original silicon, large tensile stress fields are produced by the $SiO_2$ precipitates in and/or near the channel region, as a result of which the electron mobility may be increased in n-MOS elements.

Another embodiment of the invention makes it possible, by means of increasing the density and/or the size of the silicon precipitates, to increase the stress fields produced by the silicon precipitates in a controlled manner. In other words, by varying the density and/or size of the silicon precipitates, it is possible to set a desired value of the tensile stress e.g. in the channel region. In this case, it is possible, in the context of a learning process or a learning cycle, to optimize the values for the density and the size of the precipitates in order to obtain the desired tensile stress fields in the channel region without the formation of e.g. lattice defects such as dislocations in the substrate.

Another embodiment of the invention provides for a nitride liner to be formed on a partial region of the first source/drain region and/or on a partial region of the second source/drain region and/or on a partial region of the gate region. Additional tensile stress can be produced in the channel region with the aid of the nitride liner.

Exemplary embodiments of the invention provide a simple method for producing tensile stress which can be employed e.g. advantageously in the fabrication of n-MOS field effect transistors. The method can for example be integrated easily into a CMOS process flow and can be used to increase the performance of n-MOS field effect transistors.

It should be noted in this connection that the formation of the micro-cavities and the oxidation of the micro-cavities for forming the band of $SiO_2$ precipitates must be effected at the beginning of the CMOS process, more precisely after the formation of a shallow trench isolation (STI), but before the formation of a well region in the substrate by well implantation. This is due to the high temperature budget required for the oxidation of the micro-cavities.

In accordance with one embodiment of the invention, the size and the density of the micro-cavities can be controlled by means of the method steps described above. The size of the micro-cavities can scale with the transistor dimensions and be correspondingly optimized for predetermined transistor dimensions.

One advantage of a method in accordance with one exemplary embodiment of the invention over selective SIMOX methods may be seen in the fact that the method is simpler and more cost-effective than selective SIMOX since lower implantation doses and lower thermal budgets are required.

Another advantage of exemplary embodiments of the invention over SIMOX may be seen in the fact that the precipitate band formed by oxidation of the micro-cavities is thin enough, to put it another way is occupied only sparsely with precipitates, such that an electrical insulation of the channel from the bulk is avoided. In other words, sufficiently many and sufficiently large electrically conductive regions remain between the individual $SiO_2$ precipitates of the band, so that free charge carriers can be transported between the individual micro-cavities.

At the same time, however, the stress contributions of the individual cavities are superposed to form an average stress field in the channel.

In a method for fabricating a field effect transistor in accordance with another embodiment of the invention, a first source/drain region and a second source/drain region are formed in a substrate. Furthermore, a channel region is formed between the first source/drain region and the second source/drain region. Furthermore, a gate region is formed on the channel region. Furthermore, micro-cavities are formed in the substrate at least below the channel region by means of the implantation of light ions into the substrate. Furthermore, the micro-cavities are oxidized.

In a method for fabricating a field effect transistor in accordance with another embodiment of the invention, a first source/drain region and a second source/drain region are formed in a substrate. Furthermore, a channel region is formed between the first source/drain region and the second source/drain region. Furthermore, a gate region is formed on the channel region. Furthermore, micro-cavities are formed in the substrate at least below the channel region. The micro-cavities are oxidized, silicon dioxide precipitates being formed by means of the oxidation of the micro-cavities, so that a tensile stress field is produced at least in a partial region of the channel region.

Exemplary embodiments of the invention can provide for example a simple and cost-effective method for producing tensile stress in a channel region of a field effect transistor, and also a field effect transistor which at least partly circumvent or avoid problems known from conventional methods and field effect transistors.

Figure 2A:
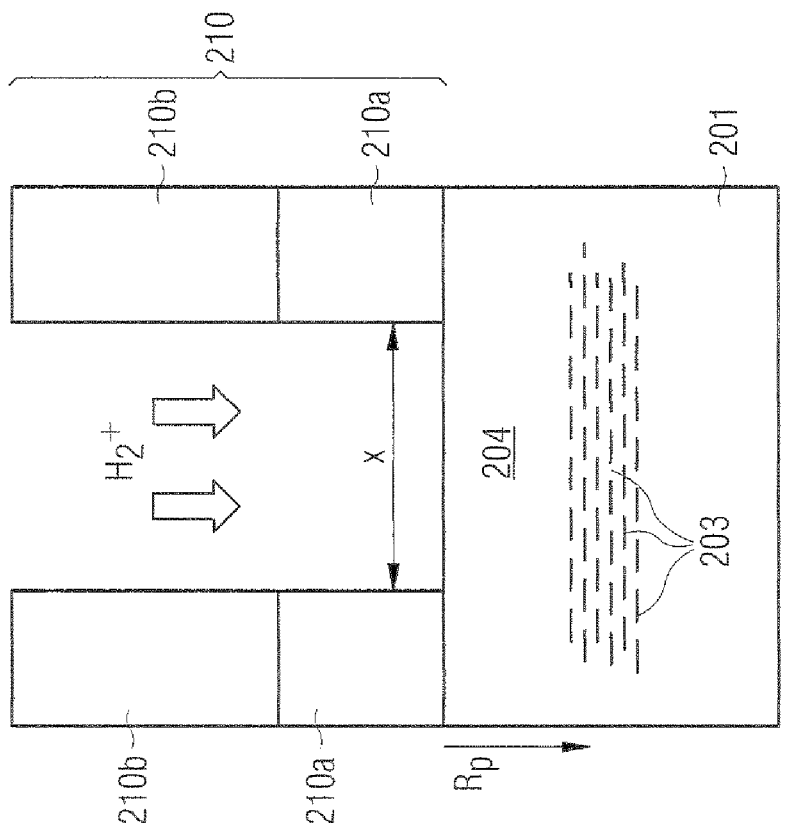
FIG. 2A shows a process step of a method for fabricating a field effect transistor in accordance with a first exemplary embodiment of the invention.

FIG. 2A shows one process step of a method for fabricating a field effect transistor in accordance with a first exemplary embodiment of the invention. The implantation of light ions, in this case $H_2^+$ ions, into a silicon substrate 201 is shown. The light ions are implanted, by way of example, with an implantation dose $\Phi=10^{16}$ cm$^{-2}$ and an implantation energy E=38 keV. By virtue of the implanted light ions, covalent silicon bonds in the substrate 201 are broken and micro-platelets 203 are formed, preferably in a narrow band 205 centered around the concentration maximum, clearly the range (projected range) $R_p$, of the light ions. $R_p$ and hence the depth of the band 205 of micro-platelets 203 can be varied by varying the parameters dose $\Phi$ and energy E. The parameters dose $\Phi$ and energy E can be chosen such that the micro-platelets are formed below the channel region 204 of the transistor to be formed. As shown in FIG. 2A, the micro-platelets 203 are elongated along a plane parallel to the surface 202 of the substrate. In the case of a (100) substrate, the platelets may be elongated e.g. along the (100) plane, the lengths of the individual micro-platelets being distributed around a mean value, which is illustrated in FIG. 3.

FIG. 3 shows a frequency distribution 300 of the lengths of micro-platelets or platelet-like defects which were formed by the implantation of $H_2^+$ ions with an implantation dose $\Phi=1.3\times10^{16}$ cm$^{-2}$ and an implantation energy E=120 keV. The frequency distribution 300 reveals a mean platelet length of approximately 6.5 nm and a standard deviation of the platelet length of approximately 2.3 nm.

Figure 2B:
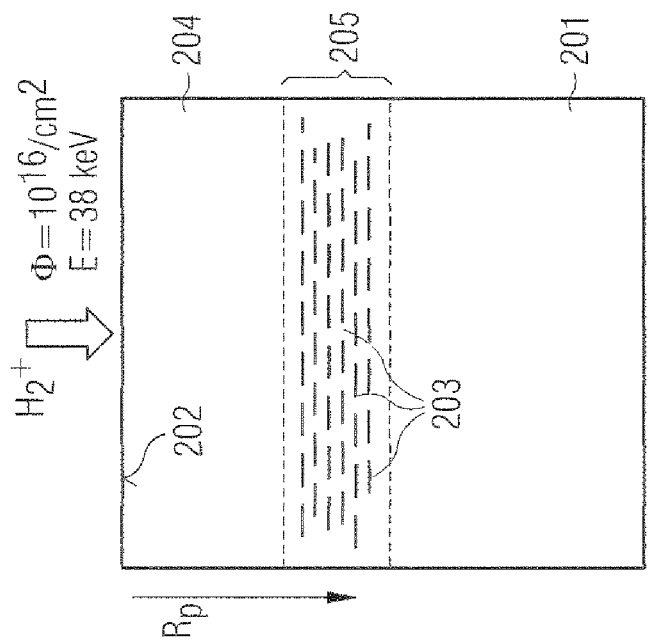
FIG. 2B shows a process step of a method for fabricating a field effect transistor in accordance with a second exemplary embodiment of the invention.

FIG. 2B shows the process step of implanting the light ions ($H_2^+$ ions in the example shown) into the substrate 201 in accordance with a second exemplary embodiment of the invention. It shows the use of a hard mask 210 composed of an oxide layer 210a and a nitride layer 210b formed on the oxide layer 210a, which are patterned in such a way that the lateral extent (identified by the double arrow "x") of the region in which the micro-platelets 203 are formed, and thus also the lateral extent of the stressed region, is restricted to the area of the channel region 204. To put it another way, the hard mask prevents micro-platelets from being formed below the source/drain regions of the field effect transistor. The mask 210 may have a size similar to the length of the transistor gate.

FIG. 2C shows a further process step of the method for fabricating a field effect transistor in accordance with the exemplary embodiment of the invention. It shows a thermal treatment of the substrate 201 and of the micro-platelets 203 formed, to put it another way a heat treatment step or annealing step with a temperature T=700° C. and a time duration of t=60 min, i.e. with a low thermal budget, which is applied to the substrate 201 and the micro-platelets 203 formed. The heating results in an outdiffusion of the implanted $H_2^+$ ions in the form of hydrogen molecules ($H_2$ molecules), and a network or a band of micro-cavities 220' is formed from the micro-platelets 203. The temperature T and the time duration t of the annealing step shown in FIG. 2C are only by way of example and can be optimized to the effect that the density and the size of the micro-cavities 220' formed do not exceed predetermined threshold values, with the result that a delamination of the substrate is avoided.

FIG. 2D shows a micrograph appertaining to cross-sectional transmission electron microscopy (XTEM) 250, in which the micro-cavities 220' formed after the first thermal treatment can be discerned.

FIG. 2E shows a further process step of the method for fabricating a field effect transistor in accordance with the first exemplary embodiment of the invention. It shows a second thermal treatment, during which the substrate is heated to a temperature of T=1100° C. for a duration of t=1 s. The second thermal treatment initiates a conservative ripening process of the micro-cavities 220 formed in the substrate 201, in the course of which a small number of large micro-cavities 220 are formed from the large number of relatively small micro-cavities 220'.

FIG. 2F shows an XTEM micrograph 260 of the large micro-cavities 220 formed after the second thermal treatment. The large micro-cavities 220 have a size such that they enclose a volume in a first dimension of between 5 nm and 100 nm, for example of between 10 nm and 100 nm, in a second dimension of between 20 nm and 100 nm and in a third dimension of between 10 nm and 200 nm, for example of between 50 nm and 100 nm. The density of the large micro-cavities 220 may be approximately $10^{11}$ cm$^{-3}$.

FIG. 2G shows a further process step of the method for fabricating a field effect transistor in accordance with the first exemplary embodiment of the invention. It shows the oxidation of the micro-cavities 220 by the introduction of oxygen into the micro-cavities 220 and a simultaneous high-temperature treatment during which the substrate is heated to a temperature of T=1200° C. for the duration of t=1 h. The introduction of oxygen into substrate or into the micro-cavities 220 is effected by thermal indiffusion in this case. Another possibility for introducing oxygen into the micro-cavities 220 consists in the implantation of oxygen. Silicon dioxide precipitates 221 form as a result of the oxidation of the micro-cavities 220, which silicon dioxide precipitates ($SiO_2$ precipitates) 221 form a non-continuous layer below the channel region 204 of the transistor. On account of the oxidizing environment, a thermal silicon dioxide layer 230 forms at the substrate surface 202 with an Si/$SiO_2$ interface 231.

FIG. 2H shows an XTEM micrograph 270 of the $SiO_2$ precipitates formed after the oxidation of the micro-cavities. The oxidized micro-cavities or $SiO_2$ precipitates 221 shown in FIG. 2H have a size of approximately 30 nm.

On account of the volume of silicon dioxide that is approximately 2.25 times as large as that of silicon, the $SiO_2$ precipitates produce a high tensile stress field in or at least in the vicinity of the channel region 204. In this case, the strength of the stress field depends essentially on the size and the density of the $SiO_2$ precipitates.

The size and the density of the silicon dioxide precipitates 221 formed depend in turn on the values of the process parameters (implantation dose, implantation energy, annealing temperatures, annealing time durations), used during the individual method steps (light ion implantation, tempering, oxidation).

Figure 4B:
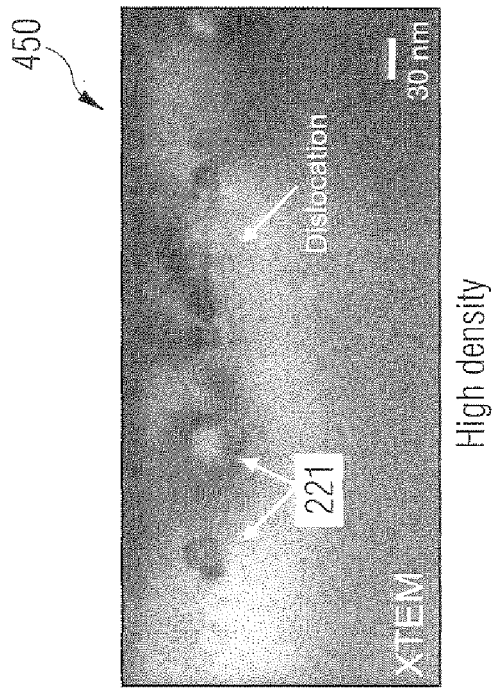
FIG. 4B shows a third XTEM micrograph of oxidized micro-cavities.
Figure 4A:
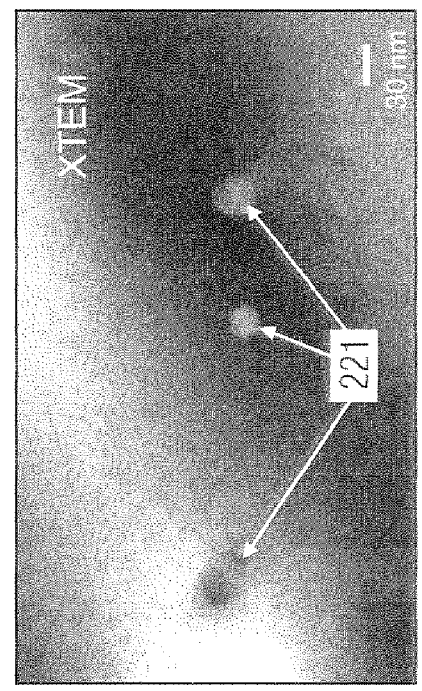
FIG. 4A shows a second XTEM micrograph of oxidized micro-cavities.

FIG. 4A and FIG. 4B show XTEM micrographs 400 and 450, respectively, of oxidized micro-cavities or $SiO_2$ precipitates which were obtained by using different light ion implantation doses and implantation energies. During the formation of the $SiO_2$ precipitates shown in the XTEM micrograph 400 (FIG. 4A), the light ion implantation was effected with a relatively low implantation dose of $2.0 \times 10^{16}$ $H_2^+$ cm$^{-2}$ and a relatively high implantation energy of 120 keV, whereas during the formation of the $SiO_2$ precipitates shown in the XTEM micrograph 450 (FIG. 4B), a relatively high implantation dose of $1.2 \times 10^{17}$ $H_2^+$ cm$^{-2}$ and a relatively low implantation energy of 38 keV were used during the light ion implantation. In both cases, the light ion implantation was followed by a first thermal treatment at 700° C. for a duration of 1 h, a second thermal treatment at 1100° C. for a duration of 1 s, and also an oxidation step at 1200° C. for a duration of 1 h.

It can be discerned from FIG. 4A and FIG. 4B that, in the case of the low implantation dose in association with the high implantation energy, a relatively low density of silicon dioxide precipitates results (FIG. 4A, "low density"), whereas a relatively high density of silicon dioxide precipitates arises for the opposite case (FIG. 4B, "high density"). The silicon dioxide precipitates shown in the XTEM micrograph 450 (FIG. 4B) therefore produce a higher stress field than those shown in the XTEM micrograph 400 (FIG. 4A). However, it can also be discerned from FIG. 4B that lattice defects in the form of dislocations formed with the parameters chosen, which is generally undesirable in the fabrication of semiconductor components.

By means of a learning process, however, it is possible to optimize the process parameters to the effect that optimum stress effects are obtained whilst simultaneously avoiding lattice defects such as e.g. dislocations.

FIG. 5 shows a field effect transistor 500 in accordance with one exemplary embodiment of the invention comprising a substrate 501 (e.g. made of silicon), in which substrate 501 a first source/drain region 502, a second source/drain region 503 and also a channel region 504 are formed. A gate insulating layer (gate dielectric) 505a (e.g. made of silicon dioxide) is formed on the channel region 504, and a conductive gate layer (gate electrode) 505b (e.g. made of polysilicon), is formed on the gate insulating layer 505a. The gate insulating layer 505a and the conductive gate layer 505b are part of the transistor gate, which is encapsulated by electrically insulating spacers 506. A nitride liner 507 is additionally formed on partial regions of the spacers 506, of the first source/drain region 502, of the second source/drain region 503 and of the conductive gate layer 505b. The field effect transistor is formed as an n-MOS field effect transistor, comprising n-doped first source/drain region 502, n-doped second source/drain region 503 and p-doped channel region 504. Dopants used may be, by way of example, boron for the p-type doping of the channel 504, and arsenic or phosphorus for the n-type doping of the first source/drain region 502 and the second source/drain region 503. In contrast to the field effect transistor 100 shown in FIG. 1, in the case of the field effect transistor 500 an individual continuous oxide layer is not formed below the channel 504, rather a multiplicity of discontinuous, i.e. non-continuous, oxidized micro-cavities 521 are formed, which oxidized micro-cavities 521 may be formed by a method for fabricating a field effect transistor in accordance with one exemplary embodiment of the invention.

It can be discerned from the illustration in FIG. 5 that the oxidized micro-cavities 521 produce a tensile stress field or tensile stress in a region which contains at least one partial region of the channel region 504 of the field effect transistor 500. To put it another way, the oxidized micro-cavities 521 formed below the channel region 504 produce a tensile stress field extending at least into a partial region of the channel region 504. The tensile stress produced in the channel region 504 or in the partial region of the channel region 504 increases the mobility of the charge carriers (electrons) in the channel 504 and hence the functionality of the n-MOS field effect transistor. The liner layer 507 likewise produces tensile stress in the channel region.

Figure 6:
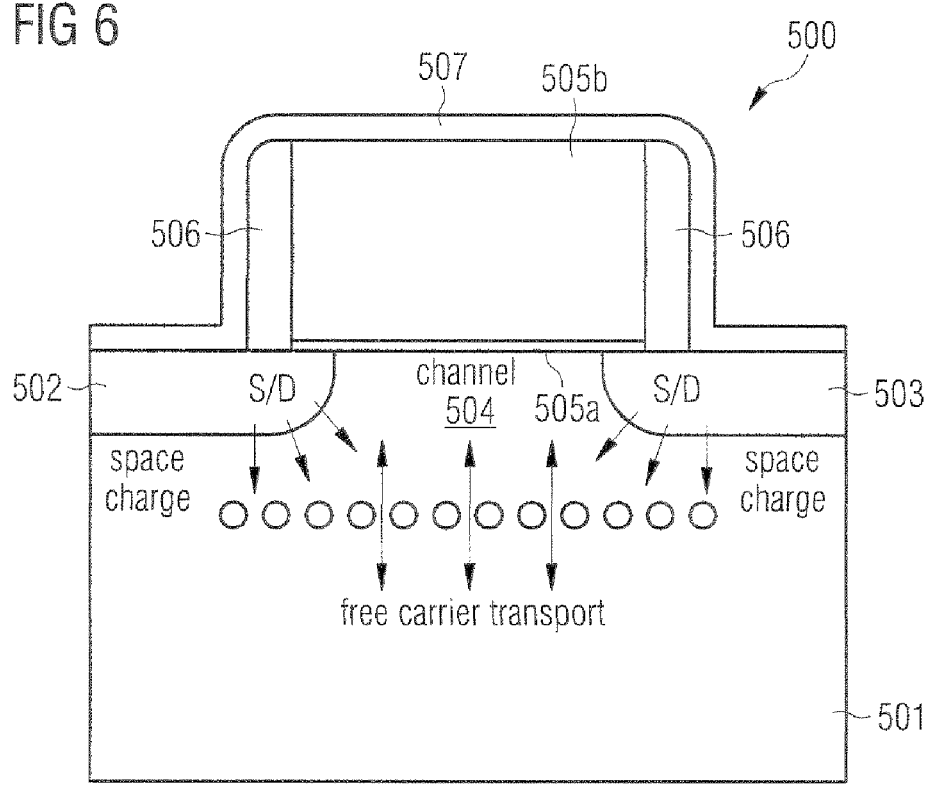

FIG. 6 shows the field effect transistor 500 from FIG. 5, the space charge regions proceeding from the first source/drain region 502 and the second source/drain region 503 being identified by the arrows designated by "space charge". Furthermore, the double arrows designated by "free carrier transport" illustrate that charge carrier transport is possible between the channel region 504 and the bulk of the substrate 501 through the conductive interspaces between the non-continuous micro-cavities 521. In other words, the channel region 504 is not electrically insulated from the bulk, as is the case with the conventional field effect transistor 100 shown in FIG. 1. Therefore, undesirable floating body effects and/or charging effects do not occur in the case of the field effect transistor 500.

Although embodiments of the present invention and their advantages have been described in detail, it should be noted that diverse changes, replacements and innovations can be made to them without departing from the essence and scope of the invention as defined by the claims hereinafter. By way of example, it is readily evident to a person skilled in the art that many of the features, functions, processes and materials which are described herein can be altered in such a way that the alterations made still lie within the scope of the present invention. Furthermore, the intention is not to restrict the scope of the present invention to the specific embodiments of the process, of the machine, of the fabrication, of the material composition, of the means, of the methods or steps which are mentioned in the description. As the average person skilled in the art can readily gather from the disclosure of the present invention, it is also possible according to the present invention to utilize processes, machines, fabrication methods, material compositions, means, methods or steps which currently exist or will be developed in the future, and which fulfill essentially the same task or achieve essentially the same result as the corresponding embodiments that have been described here. Accordingly, the intention is for the claims hereinafter to include such processes, machines, fabrication methods, material compositions, means, methods or steps within their scope.

The invention claimed is:

1. A field effect transistor, comprising:
   a substrate;
   a doped first source/drain region and a doped second source/drain region in the substrate;
   a channel region between the first source/drain region and the second source/drain region;
   a gate region on the channel region; and
   a plurality of discontinuous, oxidized micro-cavities located underneath the channel region and laterally below the first source/drain region and the second source/drain region.

2. The field effect transistor as claimed in claim 1, wherein the substrate is a silicon substrate.

3. The field effect transistor as claimed in claim 2, wherein the silicon substrate is a (100) silicon substrate or a (111) silicon substrate.

4. The field effect transistor as claimed in claim 1, wherein the oxidized micro-cavities produce a tensile stress field.

5. The field effect transistor as claimed in claim 1, wherein the field effect transistor is an n-MOS field effect transistor with an n-doped first source/drain region, an n-doped second source/drain region, and a p-doped channel region.

6. The field effect transistor as claimed in claim 1, further comprising a nitride layer on at least one region selected from the group of regions consisting of a partial region of the first source/drain region, a partial region of the second source/drain region, and a partial region of the gate region.

7. The field effect transistor as claimed in claim 1, wherein the substrate is a silicon substrate, and wherein the oxidized micro-cavities are silicon dioxide precipitates.

* * * * *